United States Patent
Moriceau et al.

(10) Patent No.: US 7,264,996 B2
(45) Date of Patent: Sep. 4, 2007

(54) METHOD FOR SEPARATING WAFERS BONDED TOGETHER TO FORM A STACKED STRUCTURE

(75) Inventors: Hubert Moriceau, Saint Egreve (FR);
Frank Fournel, Moirans (FR);
Bernard Aspar, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/947,134

(22) Filed: Sep. 23, 2004

(65) Prior Publication Data

US 2005/0112847 A1    May 26, 2005

(30) Foreign Application Priority Data

Sep. 30, 2003    (FR) .................................. 03 50619

(51) Int. Cl.
*H01L 21/44* (2006.01)
*H01L 21/30* (2006.01)

(52) U.S. Cl. ................... 438/110; 438/455; 438/458

(58) Field of Classification Search ............. 438/107, 438/110, 455, 457
See application file for complete search history.

(56) References Cited

U.S. PATENT DOCUMENTS

| 3,507,426 | A | | 4/1970 | Bielen et al. |
| 5,863,375 | A | * | 1/1999 | Cha et al. .................... 156/344 |
| 6,429,094 | B1 | * | 8/2002 | Maleville et al. ........... 438/455 |
| 6,756,285 | B1 | * | 6/2004 | Moriceau et al. ........... 438/455 |
| 2003/0077885 | A1 | * | 4/2003 | Aspar et al. ................. 438/517 |
| 2004/0171196 | A1 | * | 9/2004 | Walitzki ..................... 438/137 |

FOREIGN PATENT DOCUMENTS

| DE | 1 908 597 | | 9/1969 |
| WO | WO 2004/051735 | * | 6/2004 |

OTHER PUBLICATIONS

Patent Abstracts of Japan, JP 61-145839, Jul. 3, 1986.

* cited by examiner

*Primary Examiner*—Hsien-Ming Lee
(74) *Attorney, Agent, or Firm*—Oblon, Spivak, McClelland, Maier & Neustadt, P.C.

(57) ABSTRACT

This invention relates to a method for separating at least two wafers (1, 2) bonded together to form a stacked structure. At least one bending force is applied to all or part of the stacked structure to separate the stacked structure into two parts along a required separation plane.

Application particularly for producing a thin semiconducting layer.

11 Claims, 6 Drawing Sheets

METHOD FOR SEPARATING WAFERS BONDED TOGETHER TO FORM A STACKED STRUCTURE

TECHNICAL DOMAIN

The invention relates to a method for separating wafers bonded together to form a stacked structure. It is particularly applicable to methods for producing a thin semiconducting layer.

The structure to be separated may consist of a stack composed entirely of the same material or of several materials bonded together (by molecular bonding or by an added material). It may also consist of at least one material in which an area is weakened.

STATE OF PRIOR ART

Obtaining a thin semiconducting layer frequently involves an operation to separate this thin layer from the support on which it is bonded. Several separation techniques have been developed for this purpose.

A first approach consists of propagating an opening fracture in a structure composed of two wafers bonded together.

Note the measurement technique presented particularly by W. P. Maszara et al. in the article entitled "Bonding of silicon wafers for silicon-on-insulator" (J. Appl. Phys. 64(10), November 1998), called the Crack Opening Method. This method consists particularly of inserting a blade at the edge of a structure composed of two bonded wafers and in their bonding plane. It was developed particularly to characterise molecular bonding. This method does not provide any information about how two wafers are separated. On the contrary, it emphasises how to stop the opening wave and the need to determine the stop distance of this wave, knowing that opening is initiated by inserting a blade with constant thickness.

Other methods are based on the principle of applying a tension. Note U.S. Pat. No. 5,783,022 and U.S. Pat. No. 5,863,375 that disclose how a fluid jet can be introduced laterally while tension is applied on at least one of the wafers, at the edge of the wafer. A pad fixed to at least one of the wafers is used to pull on this wafer. Note also document EP-A-0 925 888 that discloses lateral opening of wafers bonded by the use of side plates gripping each of the wafers. The wafers are gripped by side plates, for example creating a vacuum between the wafers. For some applications, the side plates are curved. Each of the wafers is subjected to tension at its edge and in opposite directions on adjacent wafers.

A second approach consists of inserting a wedge along one (or several) radial or transverse axes, or axes parallel to the bonding plane or parallel to the plane of weakness of the bonded structure. This technique of inserting a wedge may be considered as being very similar to techniques based on tension. Document FR-A-2 823 373 discloses the insertion of a blade around the periphery of a stacked structure. In particular, the separation used enables detachment in an area weakened for example by ionic implantation. In particular, this technique provides a means of inserting a blade in the shape of an arc of a circle, adapted to the circumference of wafers to be separated.

The Fraunhofer Institute has developed a method that in particular can be used for opening along four axes to separate stacked structures. The blades are inserted along four perpendicular axes. Further information about this subject is given in the article "A new approach for handling and transferring of thin semiconductor materials" by J. Bagdahn et al. (Microsystem Technologies 9 (2003), pages 204 to 209).

The Canon K.K. Company has developed a "water jet" process consisting of using a high pressure water jet. This pressurised fluid is injected laterally into the stacked structure and parallel to the plane of the porous separation area, to separate the stacked wafers. For example, this process can be used in the ELTRAN® process for making SOI structures. In this case, separation is restricted to the porous area made in the silicon wafers during this process.

Another example is disclosed in U.S. Pat. No. 5,985,742. This patent includes the use of a high pressure fluid jet. This pressurised fluid is injected laterally to the stacked structure and parallel to the plane of the separation area, and separates the wafers to make SOI, SiGe or other structures. In this case, separation takes place at the stressed area made during implementation of the process.

According to a third approach, the separation can be localised between two wafers of a stacked structure obtained by bonding. Document FR-A-2 796 491 discloses localised opening of a stacked structure by localised creation of an overpressure created between the area to be separated and the external faces of the structure to be separated. This document does not provide any information about how the wafers are separated along a curve, but does provide information about how a fluid is added at the bonding interface by localising it.

Moreover, U.S. Pat. No. 6,387,829 discloses a method for manufacturing an SOI substrate starting from an assembly comprising a silicon donor substrate and an accepter substrate. The donor substrate has a surface covered by an insulating layer. The substrate includes a hydrogen rich layer at a determined distance from the surface. The accepter substrate is fixed to the donor substrate on the insulating layer side. Energy is input to the assembly to transform the hydrogen rich layer into a continuous layer which causes separation of the assembly.

None of the techniques according to the prior art overcomes the difficulty that consists of separating a stacked structure into two parts, the force applied along a direction transverse to the structure being badly adapted, too large and/or inducing an unwanted fracture in all or some of the structure.

SUMMARY OF THE INVENTION

The invention provides a means of overcoming the disadvantages that arise with techniques according to prior art.

The method according to the invention consists of causing opening (or detachment or separation or fracture) of the stacked structure by applying a bending force to the stacked structure (also called bonded structure and/or structure with a weakened area). One of the effects of this bending force is to cause a curved deformation of all or part of the stacked structure.

Therefore, the purpose of the invention is a method for separation of at least two wafers bonded together to form a stacked structure, characterised in that the stacked structure is subjected to at least one bending force applied to all or part of the stacked structure to separate the stacked structure into two parts, along a required separation plane.

Advantageously, in addition to the bending force, the stacked structure is also subjected to a force along the direction of the required separation plane, and tending to separate the two parts. For example, the force along the direction of the required separation plane is created by inserting a blade, a wedge or a fluid jet in the separation plane, or by applying an opening force localised in the separation plane.

The bending force may be at least partly applied after the wafers have been bonded. It may be the result of bonding of the wafers at a given temperature that causes a differential thermal expansion of the wafers, the separation taking place at a temperature different from the bonding temperature. It may also be the result of bonding of wafers under deformation.

The separation plane may be composed of the interface between the two bonded wafers.

The separation plane may also consist of a weakened plane in one of the wafers, the separation providing a first part composed of one of the wafers supporting a layer originating from the other wafer, the separation also resulting in a second part composed of the other wafer without the said layer. The weakened plane may correspond to a weakened layer induced in one of the wafers. This weakened layer may be a layer obtained by ionic implantation.

The weakened plane may also be induced by stresses produced in the volume of one of the wafers. It may consist of a specifically prepared area in one of the wafers, for example by making a silicon wafer porous at the area to be separated.

The bending force may be applied using at least one preform applying an action on one of the wafers. It may also be applied using a bending application and bending removal cycle.

Sound waves, for example ultrasound waves, may also be applied to the stacked structure to facilitate its separation.

The wafers may be bonded together while controlling the bonding energy so as to be able to separate the stacked structure as a function of a determined bending force. The bonding energy may also be controlled by controlling at least one of the following parameters: surface roughness of the wafers before bonding, the hydrophilic nature of these surfaces, the temperature of a heat treatment applied to the stacked structure.

BRIEF DESCRIPTION OF THE DRAWINGS

The invention will be better understood and other advantages and specific features will become clearer after reading the following description, given as a non-limitative example, accompanied by the appended drawings, wherein.

DETAILED PRESENTATION OF PARTICULAR EMBODIMENTS

Figure 1:
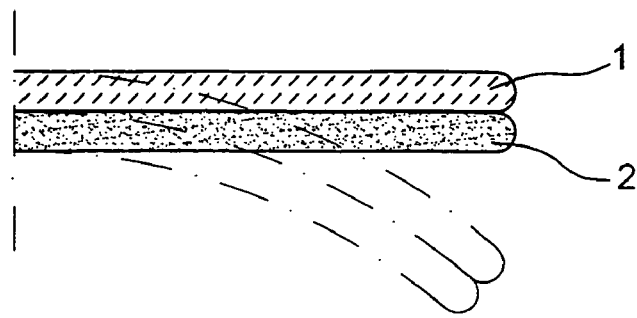
FIG. 1 is a partial view of stacked structure that illustrates the method according to the invention.

FIG. 1 illustrates the method according to the invention. It shows a side view of a stacked structure composed of two wafers 1 and 2 bonded together. Bonding may be made by molecular bonding or using an adhesive substance.

A bending force is applied such that its moment is applied about an axis perpendicular to the direction required for opening the structure to be separated. This perpendicular axis and this required direction are preferably located in the bonding interface plane or the plane of the weakened area.

The deflected structure before the detachment or separation between the two blades 1 and 2 is initiated is shown in chained dotted lines.

We will now describe some example embodiments of the invention in practical cases.

Figure 2:
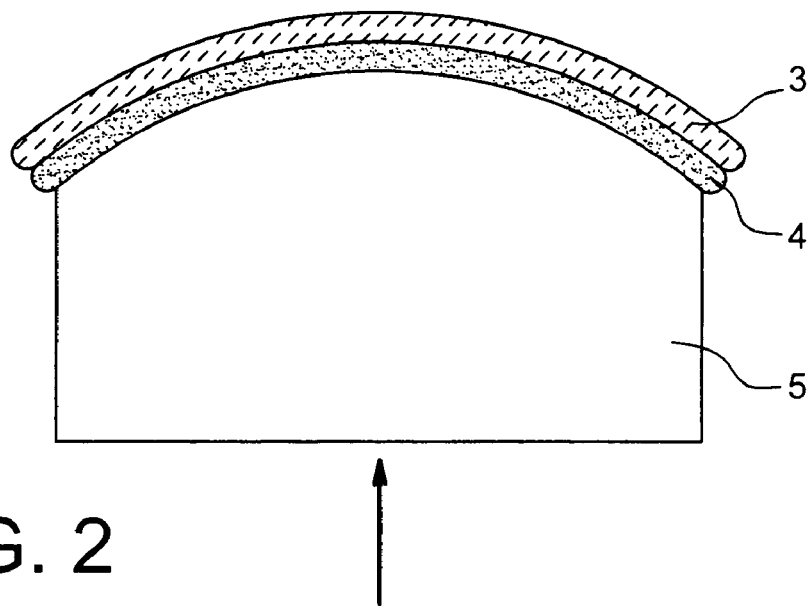
FIG. 2 is a side view illustrating a first practical case in which the invention is used.

The first practical case shown in FIG. 2 applies to a structure stacked by molecular bonding, for example in hydrophilic mode, at ambient temperature. For example, it is composed of a 200 mm diameter silicon wafer 3 bonded to a glass wafer 4 (or an molten silica or quartz wafer) that is also 200 mm diameter. Bonding was done while the wafers were in a plane position.

Separation is initiated by applying a bending force on the stacked structure, for example by pressing on the side of the glass wafer 4, respecting the circular symmetry of the bonded structure. This is shown in FIG. 2, in which the structure is subjected to a bending force through a preform 5. Separation propagates over the entire surface of the structure to be separated, located at the bonding interface.

Separation is facilitated, for example by the difference in the stiffness of the materials. In particular, this bending force may be assisted by a transverse force applied at the bonding interface, for example to initiate the separation.

The stacked structure may be held on the preform, for example by suction or by lateral attachments. Advantageously, bending application and bending removal cycles can be introduced, thus tending to weaken the bonding area to be separated.

In the second practical case, the structure to be separated is a hetero-structure and is stacked by molecular bonding, for example in so-called hydrophilic mode, at a given temperature, for example 80° C. For example, it is composed of a 200 mm diameter silicon wafer bonded onto a 200 mm diameter glass wafer (or molten silica or quartz, etc.). After bonding, the structure is cooled at ambient temperature and is deformed by homogenous bending creating a deflection.

Figure 3:
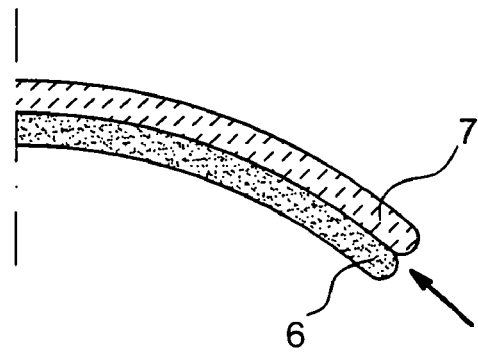
FIG. 3 is a side view illustrating a second practical case in which the invention is used.

The cooled structure is then in a convex shape as shown in FIG. 3. In this example, the wafer 6 (for example made of silicon) is the lower convex shaped part and the glass wafer 7 is the upper part.

Separation is initiated by applying a bending force onto the lower wafer of the structure, thus making it more or less convex. The separation is propagated over the entire surface of the structure to be separated, located at the bonding interface. Separation is more or less facilitated depending on the stiffness of the materials.

Separation is facilitated by the difference between the thermal expansion of the materials in each of the initial wafers in the stacked structure. Thus, in another stacked structure composed of a sapphire wafer bonded onto a silicon wafer, the large difference in the coefficient of thermal expansion facilitates separation by the application of bending on the bonded structure.

In particular, this bending force may be assisted, for example to initiate separation, by a transverse force applied at the bonding interface as shown diagrammatically by an arrow in FIG. 3.

Advantageously, bending application and bending removal cycles are applied, thus weakening the bonding area to be separated.

Figure 4A:
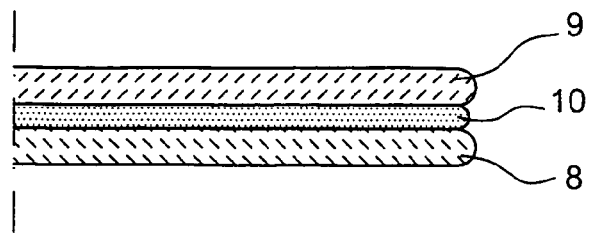
FIG. 4A is a partial view of a stacked structure obtained by bonding of two wafers.

In the third practical case, the structure to be separated is obtained by non-molecular bonding of two wafers as shown in FIG. 4A. It is composed of a 200 mm diameter silicon wafer 8, bonded onto a glass wafer 9 that is also 200 mm diameter. Bonding is done using an adhesive substance 10 such as a glue (for example thermosetting under UV, cyanolite, etc.) a wax, a resin (for example an Apiezon resin) or a metal with a low melting point (for example gallium or a tin or indium alloy), or a non-adhesive substance. Separation is initiated by applying a bending force onto the structure, thus making it more or less convex.

For example, the bending force can be applied using a preform corresponding to the convex shape required for the wafer, and this wafer will be held on this preform, for example by suction or by lateral attachments.

Figure 4B:
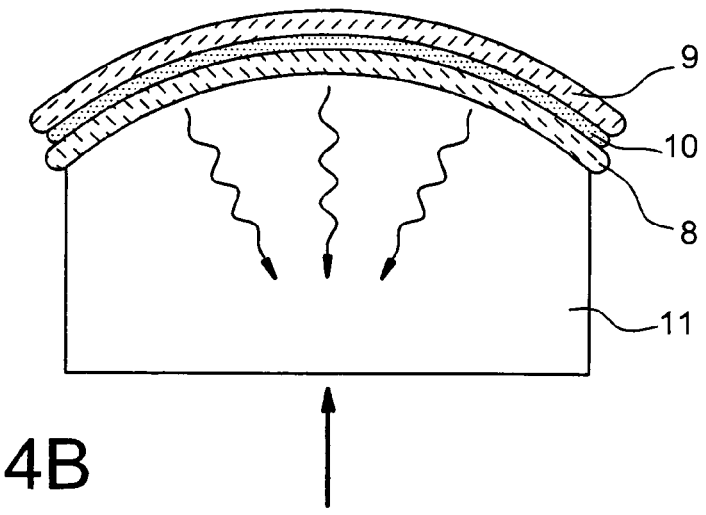
FIGS. 4B and 4C are side views illustrating a third practical case in which the invention is used.

FIG. 4B shows the structure in FIG. 4A subjected to a bending force by means of a preform 11 holding the wafer 8 in place by suction.

Figure 4C:
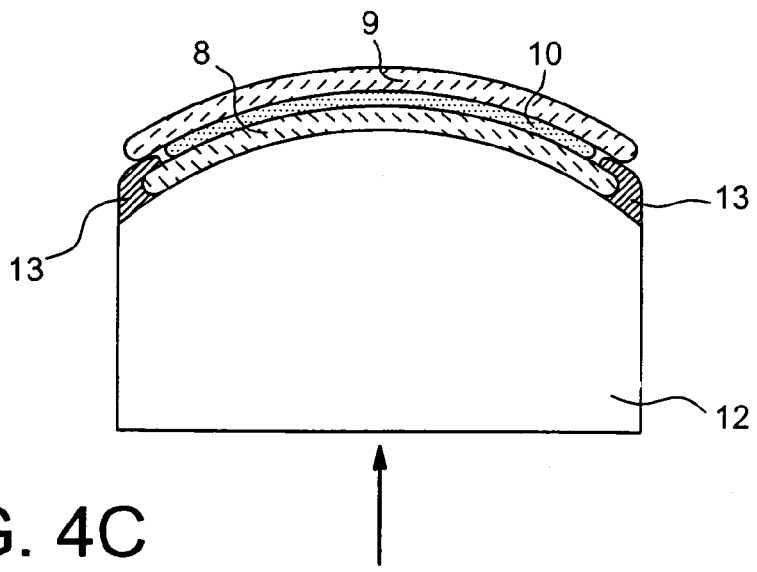

FIG. 4C shows another approach. The structure in FIG. 4A is subjected to a bending force through a preform 12 holding the wafer 8 by lateral attachments 13.

Advantageously, adhesive substances that do not resist shear, or bonding materials that induce different stiffnesses at the bonding interface, are used.

In particular, this bending force may be assisted by a transverse force applied at the bonding interface.

Advantageously, bending application and bending removal cycles are introduced, thus inducing fatigue in the bonding area in the structure to be separated.

Advantageously, depending on the nature of the adhesive substance, the bending force will be assisted by heat treatment applied before, during and after the opening method. Similarly, it may be assisted by light radiation, for example UV type light radiation.

In the fourth practical case, one of the two wafers of the future stacked structure is weakened by implantation of one or several species, for example gaseous species such as hydrogen or helium.

Figure 5A:
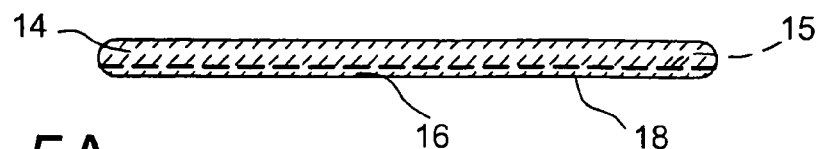
FIGS. 5A to 5D are side views illustrating a fourth practical case in which the invention is used.

FIG. 5A shows a silicon wafer 14 with a weakened area 15 obtained by hydrogen implantation. For information, the implantation may be done for a dose of $6\times10^{16}$ atoms/cm$^2$ and an energy of 70 keV. The weakened area 15 delimits a thin layer 16 with respect to the implantation face 18.

Figure 5B:
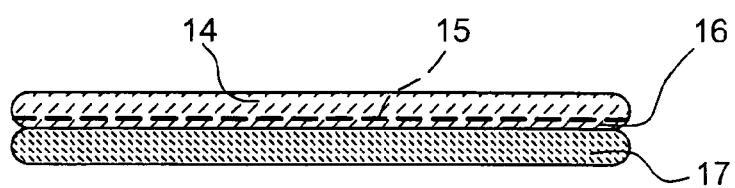

FIG. 5B represents a stacked structure obtained by molecular bonding of the wafer 14 on a wafer 17, for example made of glass. Bonding was done such that the thin layer 16 is in contact with the wafer 17.

The stacked structure is then subjected to a heat treatment, for example at 300° C. for one hour to induce controlled weakening in the wafer 14 at the weakened layer 15.

Figure 5C:
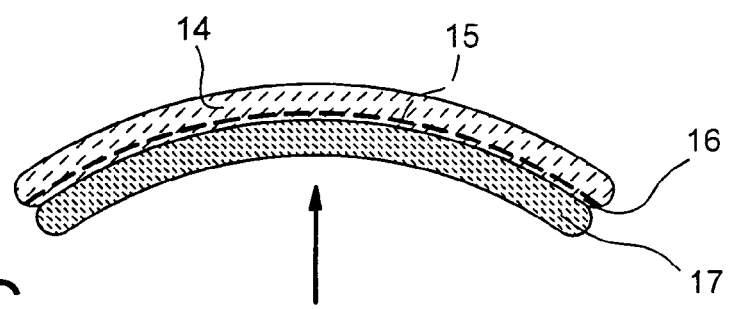

Bending is then induced in the structure 18, either at the side of the back face of the wafer 14 (in other words the face opposite the implantation face) or on the side of the wafer 17. This is as shown in FIG. 5C. Bending is continued until the structure is separated at the weakened layer 15, thus providing two distinct parts.

Figure 5D:
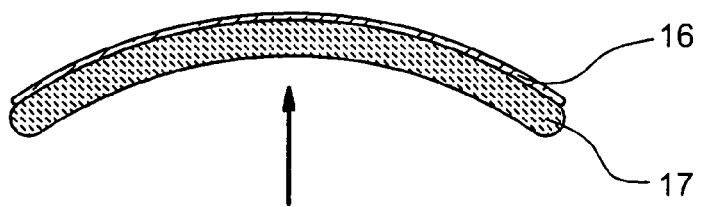

The two wafers 14 and 17 are separated from each other, the thin layer 16 originating from wafer 14 remaining fixed to the wafer 17 that acts as a support for it. FIG. 5D shows the wafer 17 covered with the thin layer 16 just after separation with the rest of the wafer 14.

The bending force may be assisted by a transverse force applied for example at the weakened layer, to initiate separation. Advantageously, bending application and bending removal cycles are introduced, thus causing fatigue of the weakened layer in the structure to be separated. The bending force may also be assisted by a heat treatment applied before, during or after this bending force.

According to one variant embodiment of the fourth practical case, the controlled weakening in the wafer 14 may be induced by a heat treatment (300° C. for one hour) before this wafer is bonded onto wafer 17. This controlled weakening applied at the same time as the heat treatment or at another time may be partially or completely induced by application of a mechanical stress, for example by tension, bending stress, etc., as is known by an expert in the subject. This application may be repeated several times.

In the fifth practical case, bonding of a second wafer onto a first wafer is replaced by an epitaxy performed on an initial wafer.

Figure 6A:
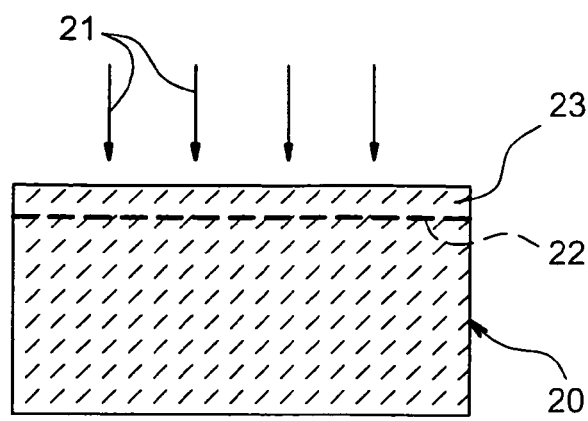
FIGS. 6A to 6C are side views illustrating a fifth practical case in which the invention is used.

FIG. 6A shows an ionic implantation step performed through a face of a silicon wafer 20. The implantation shown as reference 21 is for example done using hydrogen ions at a dose of $6\times10^{16}$ atoms/cm$^2$ with an energy of 70 keV. It induces a weakened layer 22 in the wafer 20. A heat treatment at 300° C. for one hour induces controlled weakening in the wafer at the weakened layer. A thin layer 23 is thus delimited between the implanted face and the weakened layer 22.

Figure 6B:
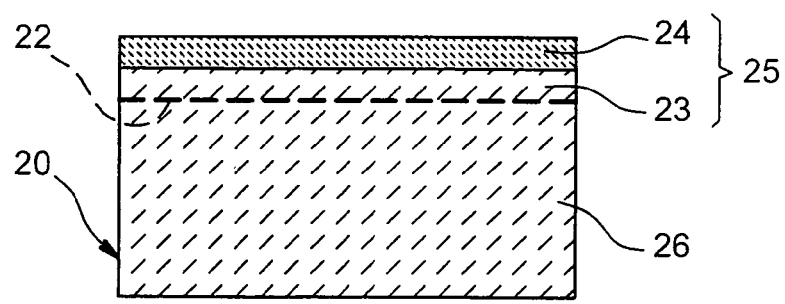

Epitaxy is then done on the implanted face of the wafer 20, for example epitaxy of silicon several micrometers thick. The result is an epitaxied layer 24 on the thin layer 23, thus forming a thick layer 25 (see FIG. 6B).

The thick layer 25 and the rest 26 of the wafer 20 form a stacked structure, the weakened layer 22 acting as an interface.

Figure 6C:
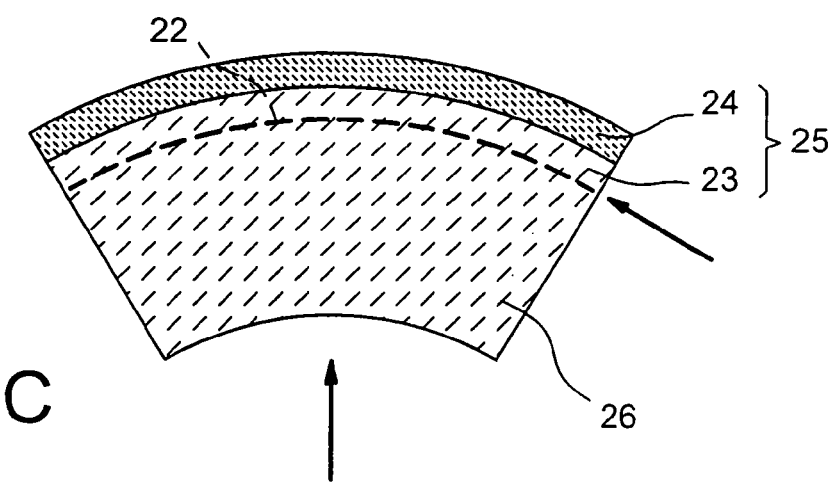

A bending step is then applied to the structure as shown in FIG. 6C until the structure is separated into two parts on each side of the weakened layer 22. Separation may be assisted by a transverse force applied to the weakened layer as shown by the arrow at the right of FIG. 6C.

In the sixth practical case, the structure is stacked by molecular bonding, for example in so-called hydrophilic mode, using surfaces that are deliberately roughened. For example, it is composed of a 200 mm diameter oxidised silicon wafer, bonded onto a 200 mm diameter oxidised silicon wafer.

The oxide films are roughened before bonding by chemical etching of HF to 49%, for example to obtain a roughness of 0.6 nm (RMS value). The bonding energy of the stacked structure obtained is closely linked to this roughness. The bonding energy reduces lower as the roughness increases.

Separation is initiated by applying a bending force onto the stacked structure, respecting the circular symmetry of the bonded structure. Separation is propagated over the entire surface of the structure to be separated, located at the bonding interface. In particular, this bending force may be assisted by a transverse force applied at the bonding interface.

For example, the bending force may be applied using a concave preform corresponding to the required bending for the structure, and the structure will be held on this preform for example by suction or by lateral attachments.

Advantageously, bending application and bending removal cycles are introduced, thus weakening the bonding area to be separated.

In one alternative of the above example, the hydrophilic nature of the surfaces before bonding can be controlled instead of controlling the roughness of the surfaces obtained by chemical etching. The bonding energy of the stacked structure also depends on this hydrophilic nature. Separation is initiated by applying a bending force on the stacked structure. In particular, this bending force may be assisted by a transverse force applied at the bonding interface.

Figure 7A:
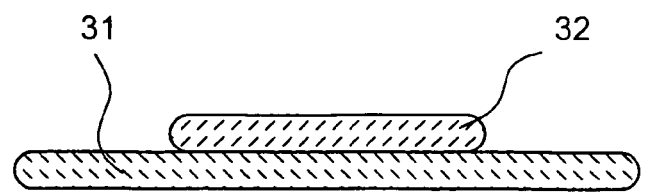
FIGS. 7A to 7C are side views illustrating a seventh practical case in which the invention is used.

In the seventh practical case, the stacked structure is composed of wafer with different diameters. Thus, FIG. 7A shows a large diameter wafer 31 bonded onto a small diameter wafer 32. Bonding may for example be of the molecular bonding type.

Figure 7B:
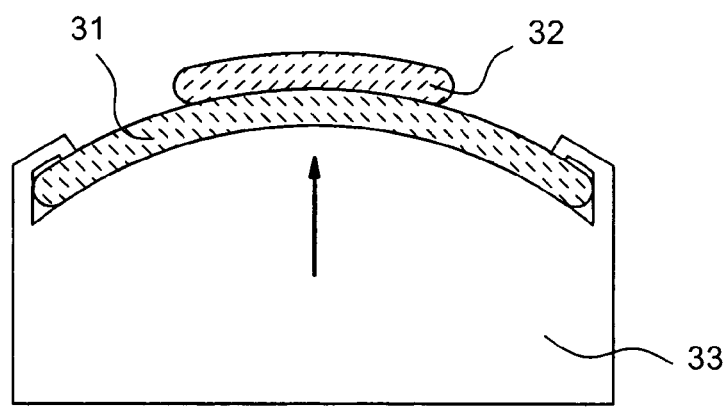
Figure 7C:
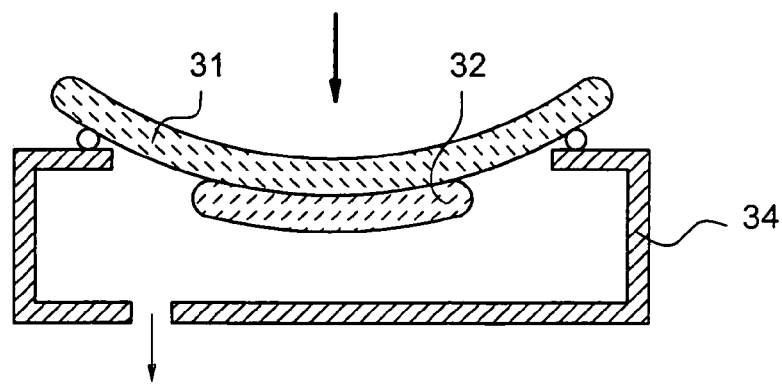

The larger of the two wafers is then used to hold the structure to be detached while bending is applied. FIGS. 7B and 7C illustrate two variants of how bending is applied to this structure.

FIG. 7B shows the stacked structure located on a preform 33 that holds the wafer 31 in place enabling bending of the structure to be detached, for example by vertical thrust.

FIG. 7C shows the stacked structure placed on a vacuum device 34. The large wafer 31 blocks off the cavity of the vacuum device 34, the small wafer 32 then being located towards the outside of the device. A negative pressure (or vacuum) is created inside the device 34, which causes bending of the structure inwards into the device which causes separation of the wafers.

For all the examples given above, it would also be possible to proceed by making the stacked structure so that it is initially bent. This initial deformation could be induced during bonding of the wafers and/or during additional steps applied to the structure to be separated, for example during different steps in the method for manufacturing of components for microelectronics. The method according to the invention can then consist of flattening or imposing controlled bending of the structure. This embodiment of the method is illustrated in FIGS. 8A to 8C.

Figure 8A:
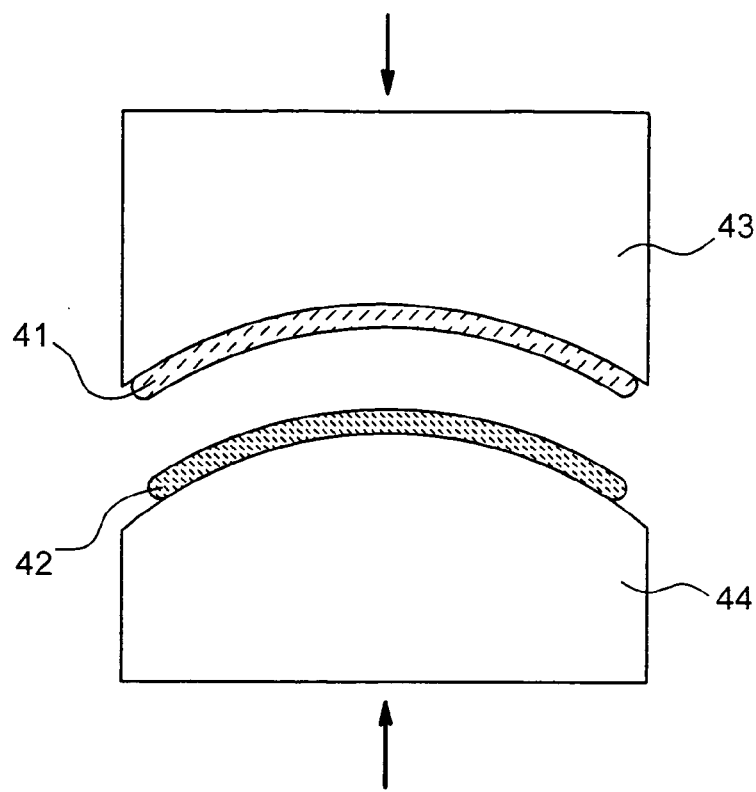
FIGS. 8A to 8C are side views illustrating another embodiment of the invention.
Figure 8B:
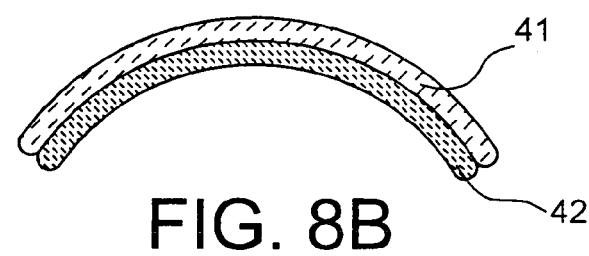
Figure 8C:

FIG. 8A shows two wafers 41 and 42 during a bonding step, for example during a molecular bonding step. Bonding is done while wafers 41 and 42 are pressed between two bonding preforms 43 and 44 with complementary shapes, which results in a stacked structure with a deflected shape.

The structure can be separated by increasing bending of the stacked structure (see FIG. 8B) or by reducing bending of the stacked structure (see FIG. 8C) until separation is achieved. Separation may result from cycles to increase and reduce the bending.

The method according to the invention may be implemented using a membrane for bending the structure to be detached or fractured. It may also be used with a flat mould and with suction.

The invention claimed is:

1. Method for separating at least two wafers bonded together to form a stacked structure, wherein a separation plane is composed of the interface between the two bonded wafers bonded together by molecular bonding or a bonding agent, comprising the step of:
    subjecting the stacked structure to at least one bending force applied to all or part of the stacked structure to separate the stacked structure into two parts, along said separation plane, said at least one bending force modifying, before initiation of the separation, the convexity of the stacked structure.

2. Method according to claim 1, wherein in addition to the bending force, the stacked structure is also subjected to a force along the direction of the separation plane, and tending to separate the two parts.

3. Method according to claim 2, wherein the force along the direction of the separation plane is created by inserting a blade, a wedge or a fluid jet in the separation plane, or by applying an opening force localised in the separation plane.

4. Method according to claim 1, wherein the bending force is at least partly applied after the wafers have been bonded.

5. Method according to claim 4, wherein the bending force applied after the wafers have been bonded is the result of bonding of wafers under deformation.

6. Method according to claim 1, wherein the bending force is applied using at least one preform applying an action on one of the wafers.

7. Method according to claim 1, wherein the bending force is applied using a bending application and bending removal cycle.

8. Method for separating at least two wafers bonded together to form a stacked structure, wherein a separation plane is composed of the interface between the two bonded wafers, comprising the step of:
    subjecting the stacked structure to at least one bending force applied to all or part of the stacked structure to separate the stacked structure into two parts, along said separation plane, wherein the bending force is at least partly applied after the wafers have been bonded, wherein the bending force applied after the wafers have been bonded is the result of bonding of the wafers at a given temperature that causes a differential thermal expansion of the wafers, the separation taking place at a temperature different from the bonding temperature.

9. Method for separating at least two wafers bonded together to form a stacked structure, wherein a separation plane is composed of the interface between the two bonded wafers, comprising the step of:
    subjecting the stacked structure to at least one bending force applied to all or part of the stacked structure to separate the stacked structure into two parts, along said separation plane, wherein sound waves are also applied to the stacked structure to facilitate its separation.

10. Method for separating at least two wafers bonded together to form a stacked structure, wherein a separation plane is composed of the interface between the two bonded wafers, comprising the step of:
    subjecting the stacked structure to at least one bending force applied to all or part of the stacked structure to separate the stacked structure into two parts, along said separation plane, wherein the wafers are bonded together while controlling the bonding energy so as to be able to separate the stacked structure as a function of a determined bending force.

11. Method according to claim 10, wherein the bonding energy is controlled by controlling at least one of the following parameters: surface roughness of the wafers before bonding at bonding surfaces, the hydrophilic nature of the bonding surfaces, the temperature of a heat treatment applied to the stacked structure.

* * * * *